US010120035B2

(12) United States Patent
Steiber et al.

(10) Patent No.: US 10,120,035 B2
(45) Date of Patent: Nov. 6, 2018

(54) MONITORING AND CONTROL OF ELECTROCHEMICAL CELL DEGRADATION VIA STRAIN BASED BATTERY TESTING

(71) Applicant: Southwest Research Institute, San Antonio, TX (US)

(72) Inventors: Joe Steiber, Spring Branch, TX (US); Jeff Qiang Xu, San Antonio, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 334 days.

(21) Appl. No.: 14/956,011

(22) Filed: Dec. 1, 2015

(65) Prior Publication Data

US 2017/0153292 A1  Jun. 1, 2017

(51) Int. Cl.
*G01R 31/36*  (2006.01)

(52) U.S. Cl.
CPC ..... *G01R 31/3679* (2013.01); *G01R 31/3648* (2013.01)

(58) Field of Classification Search
CPC ........................ G01R 31/3679; G01R 31/3648
USPC ................................................ 324/426, 427
See application file for complete search history.

(56) References Cited

U.S. PATENT DOCUMENTS

| 6,407,553 | B1 | 6/2002 | Anderson et al. |
| 7,593,821 | B2 | 9/2009 | Plett |
| 9,660,299 | B2 | 5/2017 | Xu et al. |
| 2008/0097704 | A1 | 4/2008 | Notten et al. |
| 2012/0286739 | A1 | 11/2012 | O'Brien, Jr. et al. |
| 2014/0107949 | A1 | 4/2014 | Arnold et al. |
| 2014/0368205 | A1* | 12/2014 | Svensson .............. H01M 10/48 324/426 |
| 2015/0160302 | A1 | 6/2015 | Xu et al. |
| 2015/0280290 | A1 | 10/2015 | Saha et al. |
| 2015/0311572 | A1 | 10/2015 | Sung et al. |

OTHER PUBLICATIONS

US Office Action issued in U.S. Appl. No. 14/102,197, dated Sep. 21, 2016 (5 pgs).
US Office Action issued in U.S. Appl. No. 14/102,197, dated Mar. 8, 2016 (6 pgs).

* cited by examiner

*Primary Examiner* — Farhana Hoque
(74) *Attorney, Agent, or Firm* — Grossman, Tucker et al

(57) ABSTRACT

A method and system for the monitoring and control of electrochemical cell degradation by use of strain-based battery testing. Strain-based battery is employed to recognize and implement a battery revival cycle to reduce battery degradation rates.

13 Claims, 11 Drawing Sheets

500

```
┌─────────────────────────────────────────────┐
│      Apply a strain gauge to a battery      │
│                                             │
│                     510                     │
└─────────────────────────────────────────────┘
                      │
                      ▼
┌─────────────────────────────────────────────┐
│ Measure a first strain of the battery (S1), │
│ using the strain gauge, at a selected       │
│ charge capacity of the battery and at an    │
│ initial state of the battery                │
│                                             │
│                     520                     │
└─────────────────────────────────────────────┘
                      │
                      ▼
┌─────────────────────────────────────────────┐
│ Measure a second strain of the battery (S2),│
│ using the strain gauge, at the selected     │
│ charge capacity of the battery and at an    │
│ aged state of the battery                   │
│                                             │
│                     530                     │
└─────────────────────────────────────────────┘
                      │
                      ▼
┌─────────────────────────────────────────────┐
│ Estimate the capacity degradation of the    │
│ battery from the initial state to the aged  │
│ state as equal to (S2 – S1) / S1            │
│                                             │
│                     540                     │
└─────────────────────────────────────────────┘
```

MONITORING AND CONTROL OF ELECTROCHEMICAL CELL DEGRADATION VIA STRAIN BASED BATTERY TESTING

GOVERNMENT RIGHTS CLAUSE

This invention was made with government support under Award No. DE-AR0000277 awarded by U.S. Department of Energy. The government has certain rights in the invention.

FIELD OF INVENTION

The present disclosure relates to monitoring and control of electrochemical cell degradation by use of strain-based battery testing. Strain-based battery testing now confirms the ability to recognize and implement a battery revival cycle to reduce battery degradation rates.

BACKGROUND

Batteries, including lithium-ion batteries, may be used for a variety of target applications that require relatively higher levels of energy storage, power delivery and recharge cycle capability. These applications may include, for example, hybrid electric vehicles (HEVs), plug-in hybrid electric vehicles (PHEVs), battery electric vehicles (BEVs), solar/wind (renewable) power smoothing, power grid frequency regulation, power grid storage for peak shaving and other applications. Parties, ranging from manufacturers to distributors to end users of these batteries, have an interest in determining the useful life span of the batteries and the charge capacity degradation that has occurred in an aged battery (e.g., the state of health or SOH of the battery). Accurate SOH determination may facilitate dual-use of battery systems and improve the value estimation of the battery after retirement from a primary application. Unfortunately, the lifespan may vary considerably depending on the target application and in particular the drive cycle (rate of charge/discharge) of the applications, which may include, for example, the depth of discharge and the charge and discharge rates.

Lithium-ion (Li-ion) batteries state-of-charge (SOC) and SOH are therefore two parameters of the battery cell performance. As Li-ion batteries tend to degrade during operations, a need exist for a technique to monitor and identify such degradation including the ability to confirm that a battery revival protocol has been achieved to reduce battery degradation behavior.

SUMMARY

The present disclosure describes methods and systems for strain-based estimation of the state of health (SOH) of battery cells. More specifically, a method for monitoring and control of electrochemical cell degradation and state of health (SOH) of a battery comprising applying a strain gauge to the battery and measuring a first strain of the battery (S1) using strain gauge at an initial state of said battery ($\bar{\varepsilon}_o$). This is then followed by exposing the battery to charge/discharge cycling and measuring a second strain ($\bar{\varepsilon}$) of the battery (S2) after the charge/discharge cycling, using the strain gauge, wherein the second strain is equal to $\bar{\varepsilon}_o + \Delta \bar{\varepsilon}$, where $\Delta \bar{\varepsilon}$ is the measured change in strain and wherein the strain is a function of battery voltage and the rate of change of the battery SOH varies with respect to strain. This is then followed by determining a change in the SOH of the battery after the charge/discharge cycling. The battery may then be exposed to a revival cycle comprising thermal treatment wherein the SOH is determined to be less than or equal to 2.0%.

BRIEF DESCRIPTION OF DRAWINGS

The above-mentioned and other features of this disclosure, and the manner of attaining them, will become more apparent and better understood by reference to the following description of embodiments described herein taken in conjunction with the accompanying drawings, wherein:

FIG. 5 illustrates a flowchart of operations of one exemplary embodiment consistent with the present disclosure;

DETAILED DESCRIPTION OF PREFERRED EMBODIMENTS

Figure 1:
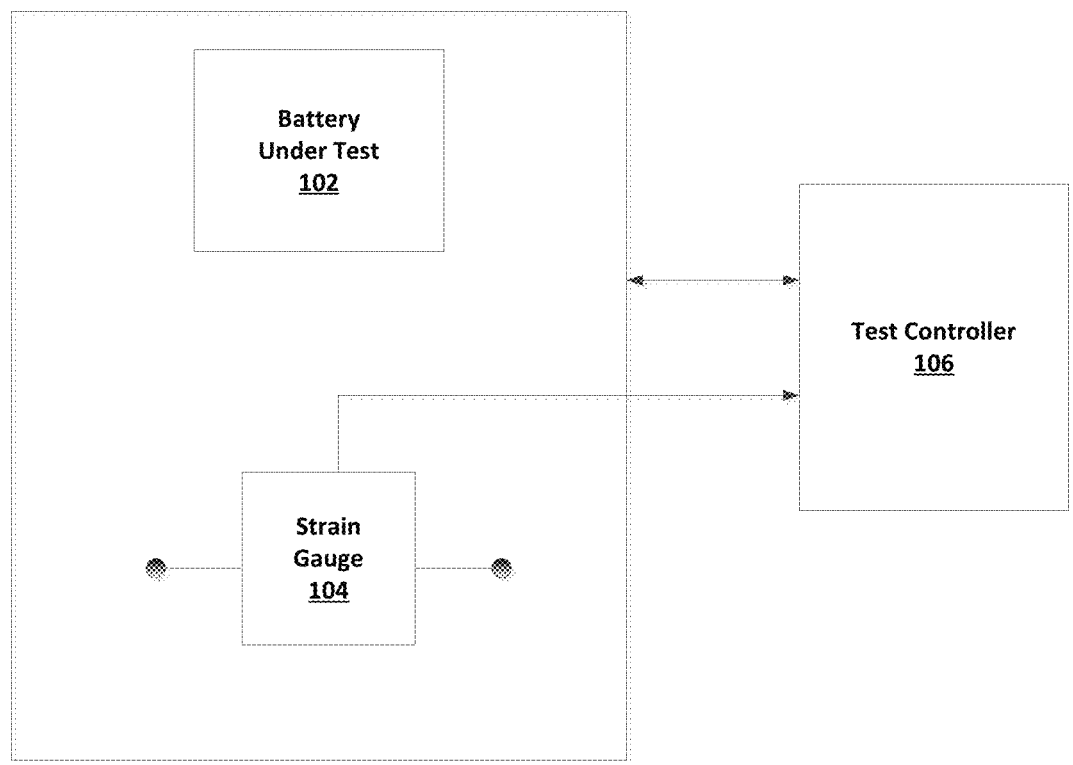
FIG. 1 illustrates a top-level block diagram of one exemplary embodiment consistent with the present disclosure.

It may be appreciated that the present disclosure is not limited in its application to the details of construction and the arrangement of components set forth in the following description or illustrated in the drawings. The invention(s) herein may be capable of other embodiments and of being practiced or being carried out in various ways. Also, it may be appreciated that the phraseology and terminology used herein is for the purpose of description and should not be regarded as limiting as such may be understood by one of skill in the art.

Throughout the present description, like reference characters may indicate like structure throughout the several views, and such structure need not be separately discussed. Furthermore, any particular feature(s) of a particular exemplary embodiment may be equally applied to any other exemplary embodiment(s) of this specification as suitable. In other words, features between the various exemplary embodiments described herein are interchangeable, and not exclusive.

The present disclosure relates to strain-based estimation of the state of health (SOH) of batteries, battery cells, modules or pack systems. The SOH is understood herein a measurement that reflects the general condition of a battery and its ability to deliver the specified performance compared with a fresh battery. It preferably takes into account such factors as charge acceptance, internal resistance, voltage and self-discharge. It is a measure of the long term capability of the battery and gives a general indication of how much of the available lifetime energy throughput of the battery has been consumed and how much is left. It may be expressed as a relative percent of battery cell degradation.

The SOC determination is understood herein as a reference to the amount of energy left in the battery compared with the energy the battery had when it was fully charged, and provides the user with an indication of how much longer a battery will continue to perform before recharging. Using the analogy of a fuel tank in a car, State of Charge (SOC) estimation is often called the "Gas Gauge" or "Fuel Gauge" function.

A battery pack may comprise a number of battery cells configured in any suitable arrangement, typically to provide a desired voltage, current and/or form factor. As a battery ages, the charge capacity of the battery generally degrades due to undesirable side effects (electrode and/or electrolyte degradation) associated with the chemical reactions involved in the charging and discharging process or even when the battery is in an idle condition. These changes over time, for example, in the internal crystal structure of the battery electrode materials, can cause the volume of the battery cell to vary. A strain gauge may be configured to measure changes in one or more of the dimensions of the battery, for example length, width, height or any combination thereof. These dimensional changes may be associated with a change in the volume of the battery during charging, discharging and/or rest periods, as will be described in greater detail herein. The strain gauge measurement may thus be used to predict or estimate the battery's SOH as it ages. It will be appreciated that this may be useful to determine when the battery should be retired or re-purposed as well as the relative value of the battery at any point in its life cycle.

Many types of batteries exist which may be based on different chemical reactions between their constituent chemical components. For example, lithium ion batteries are based on lithium ion intercalation and de-intercalation mechanisms during the charging and discharging processes. Both metal oxides and carbon-based electrode materials are ion-intercalation compounds or elements. During charging or discharging, reversible crystallographic strains take place due to the electrochemical force or the electromotive force that results in a volume change in the material. The strain gauge can be implemented to monitor the reversible process, which is correlated with the stages of intercalation/de-intercalation and can be expressed as a function of the state of charge (SOC), state of discharge (SOD), which is the complement to the SOC, and/or absolute charge capacity (Q) of the battery. When the strain gauge is positioned on the battery, the measurements obtained may be correlated to the SOC, SOD and/or the SOH of the battery cell, module, or pack system. The change of strain measurement as each cell undergoes a number of charge/discharge cycles can be used to interpret the SOH of the cell at a given charge capacity.

Continuing with the example of the lithium ion battery, during the charging process lithium ions are extracted from the cathode (de-intercalation) and inserted into the anode (intercalation). During the discharging process, lithium ions move in the opposite direction. Modern lithium-ion batteries may often use mixed metal oxides as the cathode and graphite or amorphous carbon or silicon or silicon-carbon composite or carbon-tin alloy as the anode. The electrode materials experience volume strain during intercalation and de-intercalation processes. The volume change is the combination and macro-expression of electrode material crystalline structure change, expansion, and/or shrinkage due to electrochemical or electromotive forces on the cathode and anode. This phenomenon is dependent on the electrode chemistry, the related material's physical characteristics, cell formats, and the cell fabrication process. Since the electrode strain is a direct reflection of the percentage of lithium ion molar percentage insertion and extraction at each state of charge, embodiments of the present disclosure may identify the correlation between battery volume changes versus the SOC and SOD.

The electro-chemical reaction that takes place during charging and discharging may be expressed as follows when $LiFePO_4$ is used as the cathode, and graphite carbon is used as the anode:

Cathode during charge from 0% SOC to x*100% SOC:

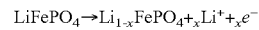
$$LiFePO_4 \rightarrow Li_{1-x}FePO_4 + xLi^+ + xe^-$$

Cathode during discharge from 0% SOD to x*100% SOD:

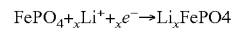
$$FePO_4 + xLi^+ + xe^- \rightarrow Li_xFePO4$$

Anode during charge from 0% SOC to x*100% SOC:

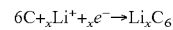
$$6C + xLi^+ + xe^- \rightarrow Li_xC_6$$

Anode during discharge from 0% SOD to x*100% SOD:

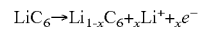
$$LiC_6 \rightarrow Li_{1-x}C_6 + xLi^+ + xe^-$$

As the battery cell undergoes numerous charge/discharge cycles a degradation of the electrode materials is caused by the repeated intercalation and de-intercalation of lithium ions inside the material's crystal structure and other undesirable side reactions. The degree of material crystal structure change correlates with the volume change of the battery as cycling continues. In other words, for example, the measured strain at the $10^{th}$ charging cycle will be different from the measured strain at the 20th or 100th charging cycle or $1000^{th}$ charging cycles. As a result, this gradual change of strain can be used to formulate a predictable assessment of a battery cell's SOH, as will be described in greater detail herein.

Strain is generally proportional to both the partial change due to crystallographic change of electrode materials and the partial change due to temperature when the battery is under controlled voltage window charging or discharging. Thus, significant side reactions are avoided to produce gases (side reaction products). Temperature may be affected by both internally generated heat as well as the external or ambient test environment temperature. Crystallographic change and temperature, however, may be decoupled by holding temperature relatively constant or by allowing electrochemical equilibrium to be reached before measuring strain, at which point detectable differences in strain measurements may be assumed to be caused by crystallographic change, and therefore aging of the battery.

Referring now to FIG. 1, there is shown a top-level block diagram 100. A system configured to perform strain-based estimation of the SOH of a battery 102 may include a strain gauge 104 applied to the battery and a test controller 106 configured to measure one or more properties of the battery, including the strain, under various test conditions. The strain gauge 104 may be any device configured to measure the strain of an object, in this case battery 102. The strain may be associated with a change in volume of the battery at various states of charge capacity, age, temperature and other conditions. In some embodiments, the strain gauge 104 may be applied at a position and orientation that measures the battery cell expansion and contraction, during cell charge/discharge cycles, along a dimension of the battery that exhibits the maximum expansion and contraction. For example, if, as the battery volume changes, the major portion of that change occurs along the width dimension, the strange gauge may be oriented along the width dimension. These positions/orientations may depend on the cell design (cylindrical, pouch, prismatic, etc.) and may also be dependent on battery chemistry.

In some embodiments, the strain gauge 104 may be applied with direct physical contact to the battery or battery cells. In other embodiments, the strain gauge 104 may be applied to a strap or other device that is configured to secure one or more cells of a battery pack. This arrangement may provide a cost benefit by reducing the number of strain gauges required and may also provide additional beneficial temperature insulation between the strain gauge and the battery cells.

Figure 2:
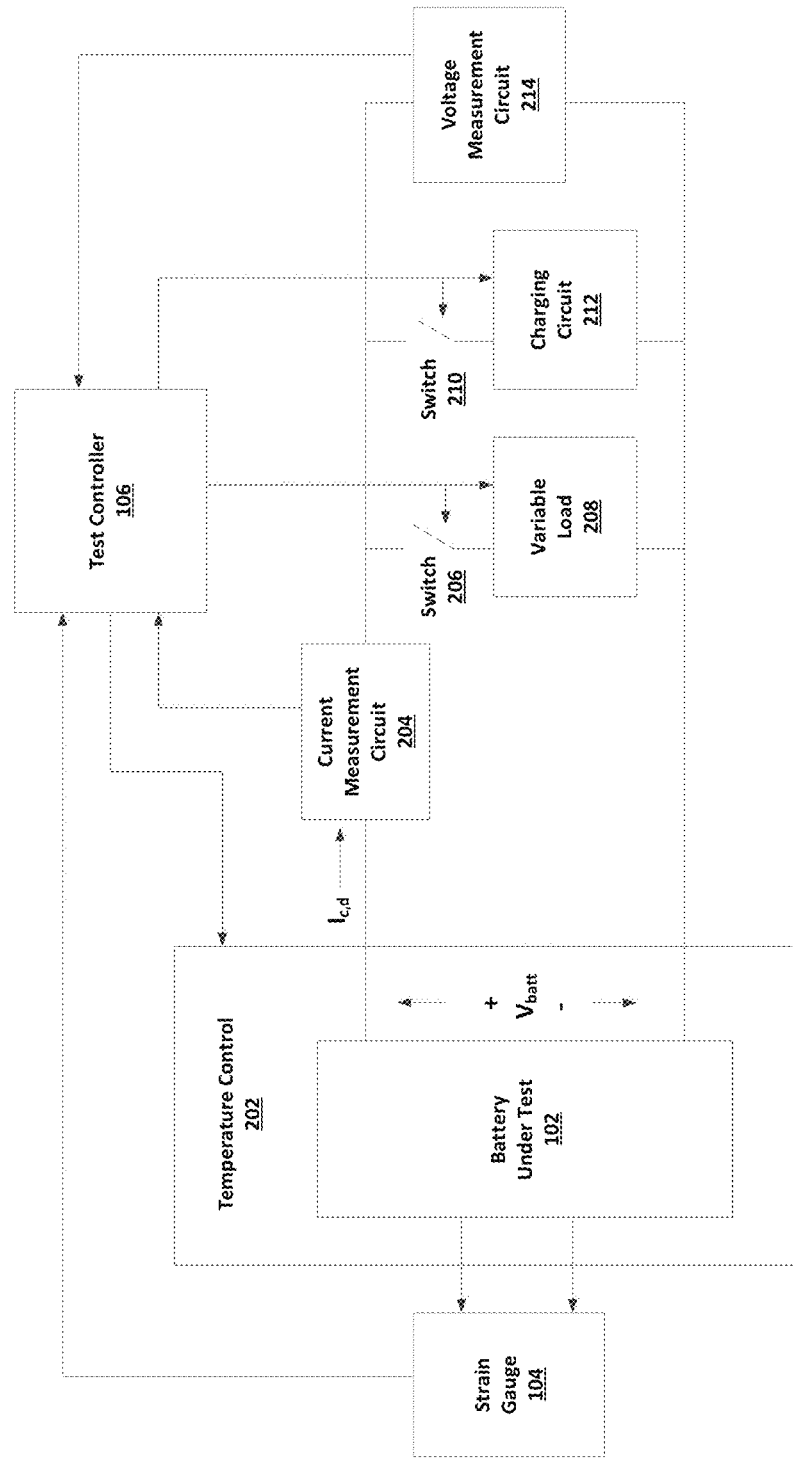
FIG. 2 illustrates a system block diagram of one exemplary embodiment consistent with the present disclosure.

Referring now to FIG. 2 there is shown a system block diagram 200 of one exemplary embodiment consistent with the present disclosure. A system configured to perform strain-based estimation of the state of health of battery cells 102 may include any of: a current measurement circuit 204, a voltage measurement circuit 214, a variable load 208 and associated switch 206, a charging circuit 212 and associated switch 210, and a temperature control module 202, in addition to the strain gauge 104 and test controller module 106. The battery (or cell) to be tested 102 may be maintained at a controlled temperature prior to and/or during the test by temperature control module 202, which in some embodiments may be an oven or other suitable heating or cooling device such as a thermal chamber or bath. The temperature setting may be determined and/or monitored by test controller module 106 through any suitable type of communication signal.

Current measurement circuit 204 may be configured to measure the electric current flowing through the battery 102 at various times during the charge/discharge cycle testing, as will be explained in greater detail herein. The current may be a charging current $I_c$ to re-charge the battery, or a discharging current $I_d$, to drain the battery. Voltage measurement circuit 214 may be configured to measure the voltage, $V_{batt}$ associated with the battery 102 at any point during the cycle. Voltage measurements may be performed while the battery is being charged, drained, or while the battery is in an open circuit condition, depending on the stage of testing.

Variable load 208 may be configured to drain the battery 102, when switched into the circuit through switch 206 under the control of test controller module 106, as part of a discharge cycle. A desired discharge current $I_d$ may be generated by adjusting the impedance of load 208 which may be set by controller 106. The discharge pulse duration (or pulse width) may also be set by controller 106 based on the timing of switch 206 state changes from open to close and back to open. For example, closing switch 206 for one second will cause a one second discharge current pulse to flow from battery 102 through the variable load 208. If, for example, the battery supplies V volts and the variable load is set to an impedance of R ohms, the discharge current pulse may be V/R amps.

Charging circuit 212 may be configured to charge the battery 102, when switched into the circuit through switch 210 under the control of test controller module 106 as part of a charge cycle. Charging circuit 212 may be set or adjusted by controller 106 to generate a desired charge current $I_c$. The charge pulse duration (or pulse width) may also be set by controller 106 based on the timing of switch 210 state changes.

Test controller module 106 may thus be configured to perform test operations on battery 102, for example as part of a charge/discharge cycle, as will be described in greater detail herein. These test operations may include draining the battery to any desired depth of discharge (DOD) and cycling the battery around that DOD through charge and discharge current pulses of controllable duration and amperage. Test controller module 106 may further be configured to monitor the current and voltage of the battery 102 during these test operations while also maintaining and monitoring the temperature of the battery. In some embodiments, the charge/discharge cycle may be performed at a continuous current rate and/or a continuous power rate. In some embodiments, the charge/discharge cycle may be performed at a variable current rate and/or a variable power rate. In some embodiments, the charge/discharge cycle may be a practical driving cycle in a battery powered propulsion system. In some embodiments, the charge/discharge cycle may be a practical load cycle in an energy storage battery system.

Figure 3:
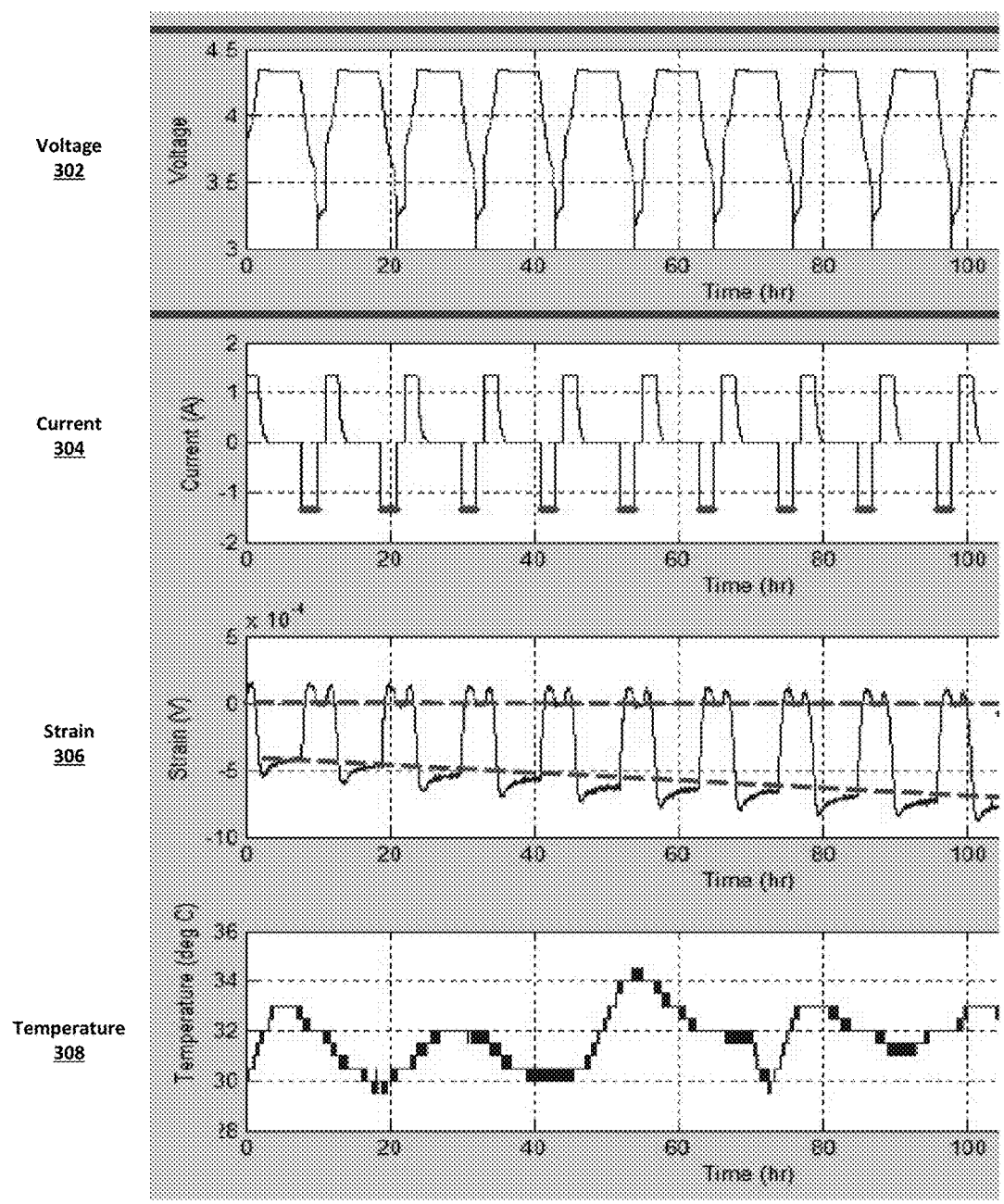
FIG. 3 illustrates test measurement graphs of one exemplary embodiment consistent with the present disclosure.

FIG. 3 illustrates test measurement graphs 300 of one exemplary embodiment consistent with the present disclosure. Measured battery voltage 302 is shown over multiple charge/discharge cycles that span a time period greater than 100 hours, in this example, as the battery is aged during the test from an initial state to an aged state. The initial state may correspond to the state of a new battery, for example, at the time of manufacture or after only limited use (e.g., less than 5 charge/discharge cycles). A battery at an aged state may correspond to a battery that has undergone a longer period of use (e.g., more than 100 charge/discharge cycles).

The corresponding battery current 304 is also shown over the test cycles. As can be seen from these plots 302, 304, there is no noticeable change in either voltage or current as the battery ages. The measured strain 306, expressed as a signal voltage from the strain gauge, however, is shown to exhibit a detectable variation over time. Plot 308 indicates the battery temperature, which is maintained at a 30 degree Celsius controlled environment within a range of 30 to 34 degrees Celsius, measured temperature fluctuation during cycles which may correspond to a nominal operating temperatures range for the battery.

Figure 4:
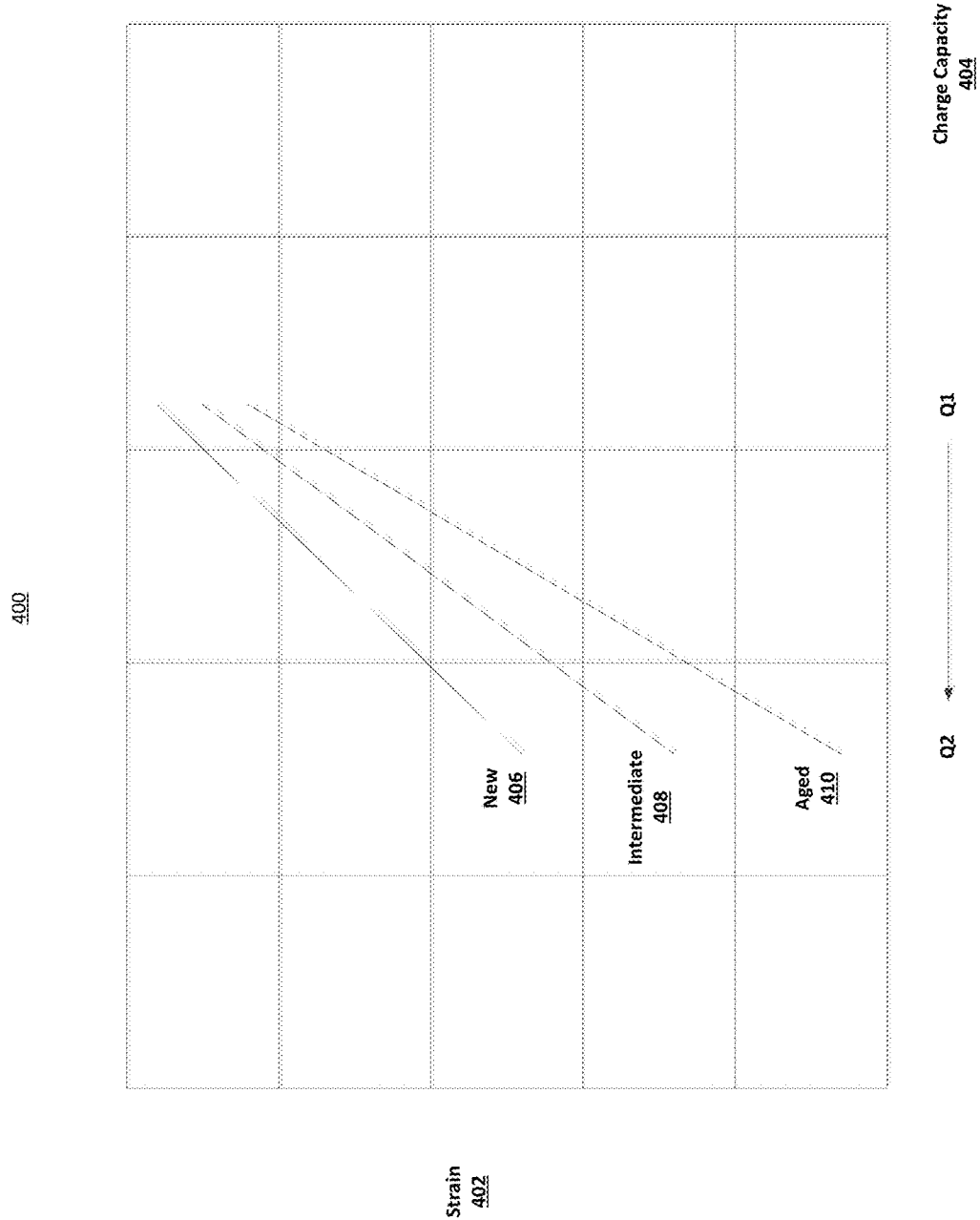
FIG. 4 illustrates test measurement graphs of another exemplary embodiment consistent with the present disclosure.
Figure 6:
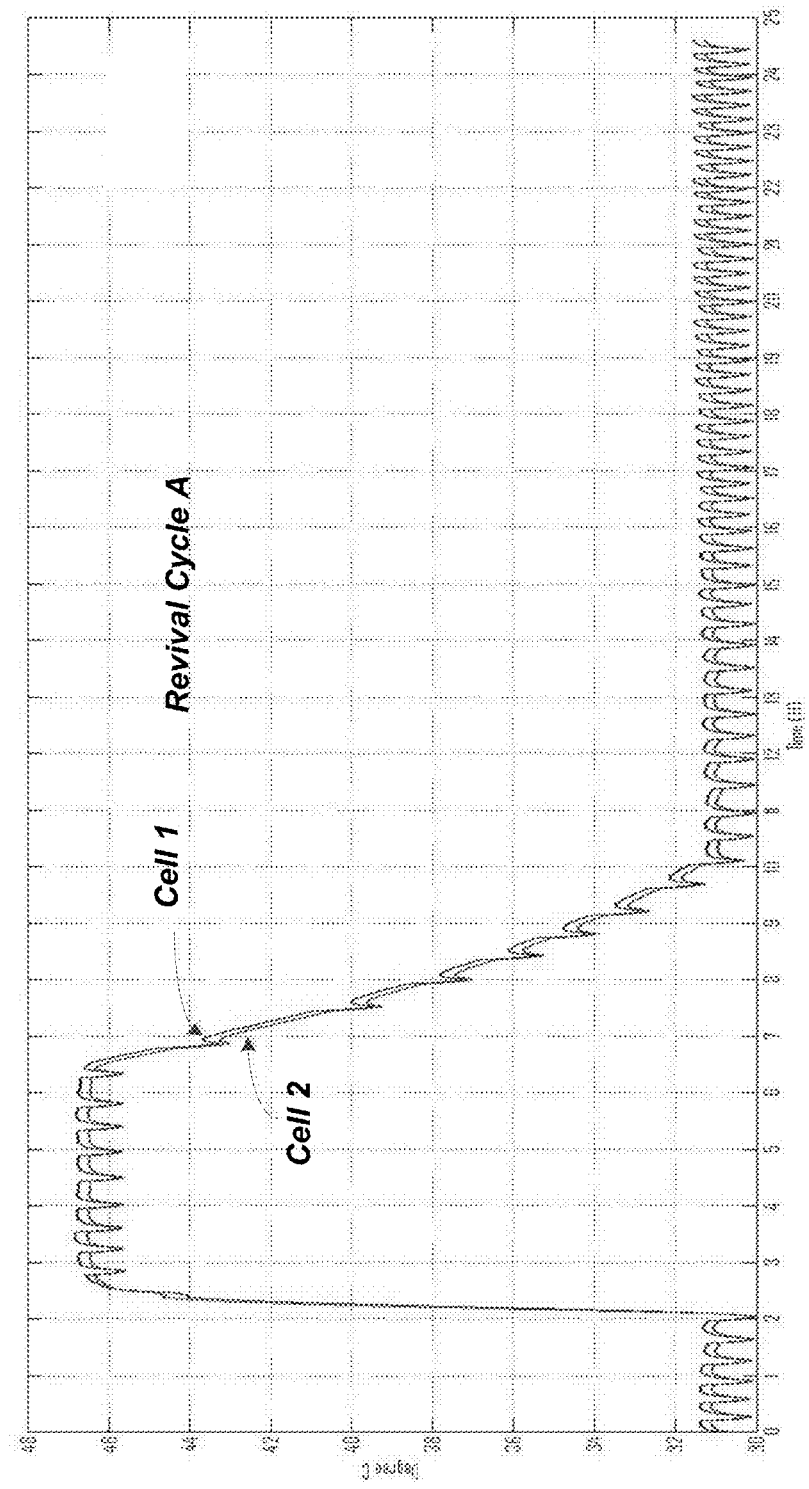
FIG. 6 illustrates the Revival Cycle A applied to Cells 1 and 2.
Figure 7:
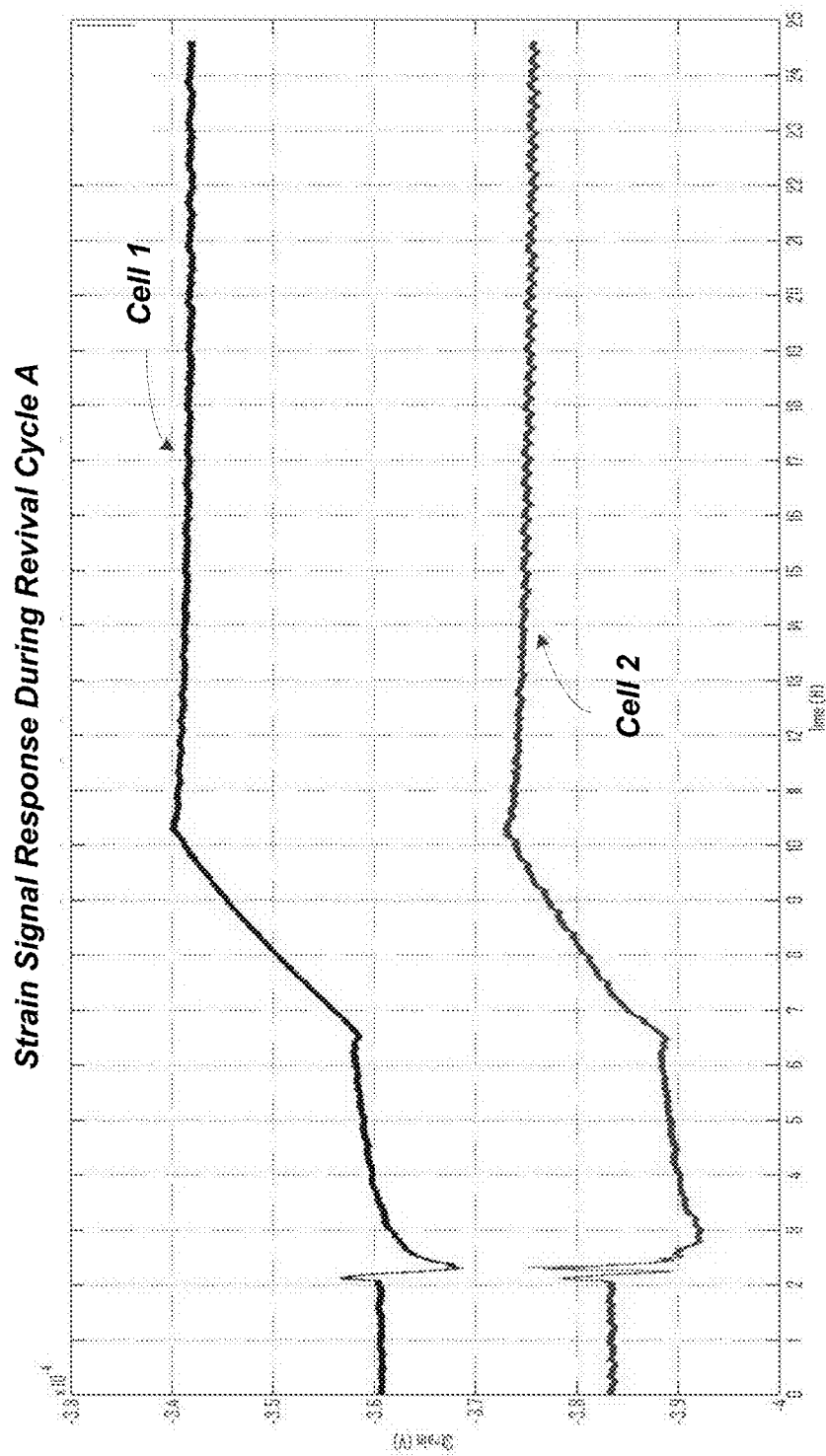
FIG. 7 illustrates the strain signal response during Revival Cycle A for Cells 1 and 2.
Figure 8:
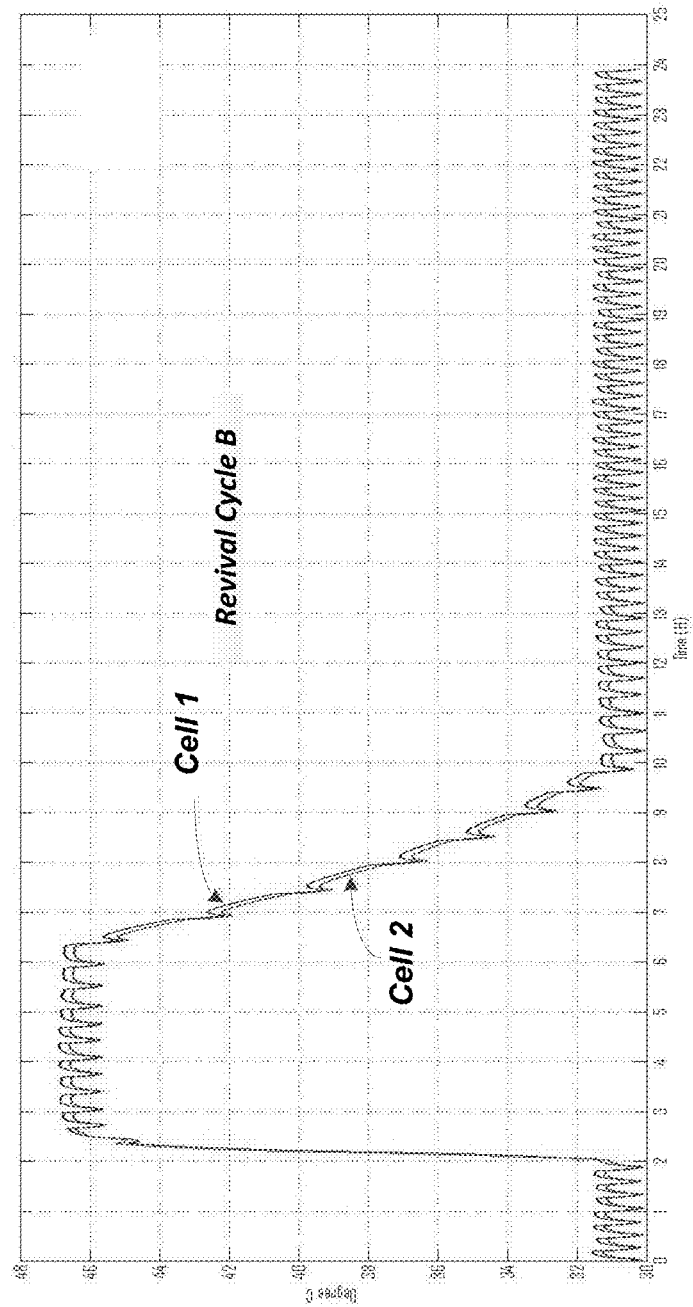
FIG. 8 illustrates the Revival Cycle B applied to Cells 1 and 2.
Figure 9:
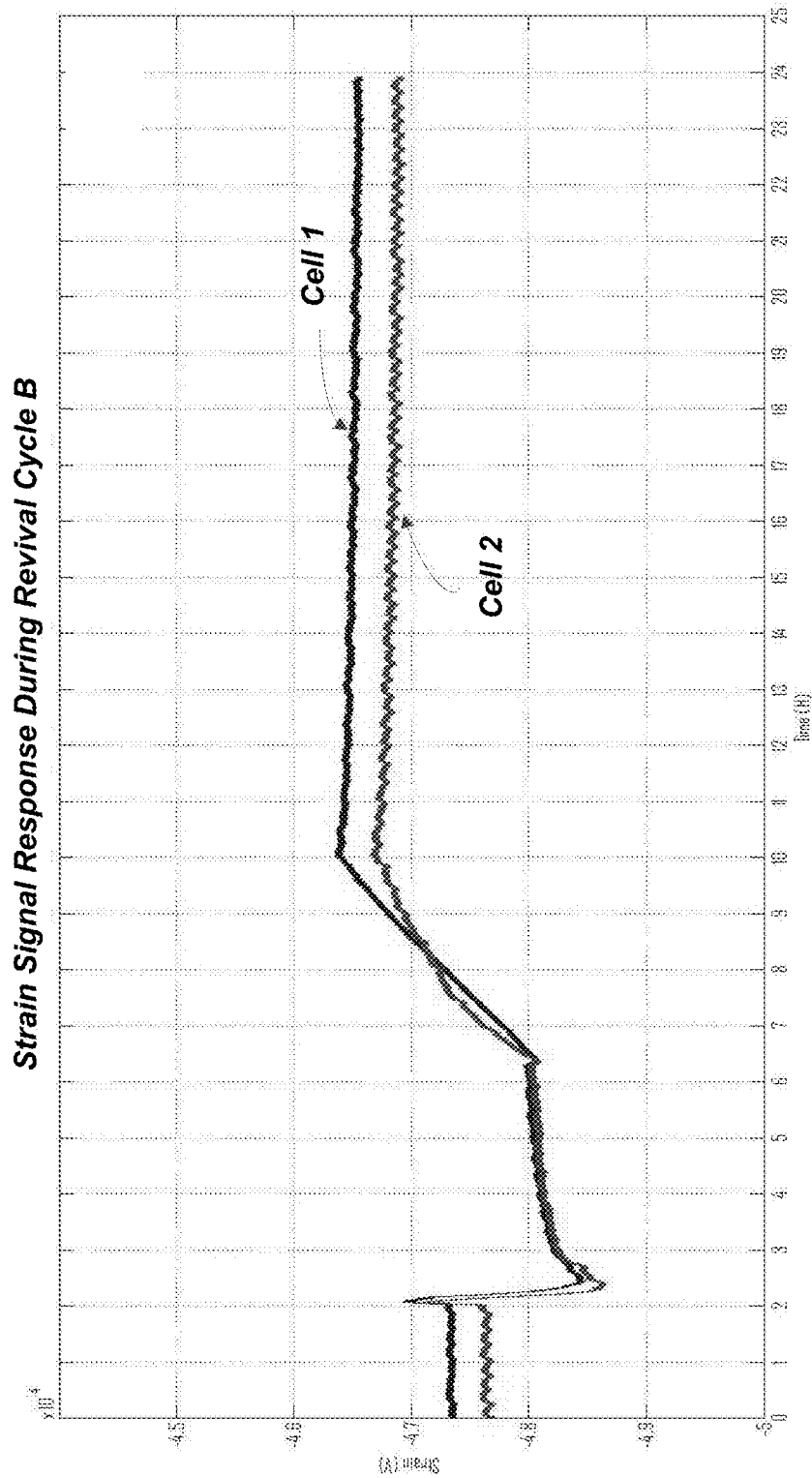
FIG. 9 illustrates strain signal response during Revival Cycle B for Cells 1 and 2.

FIG. 4 illustrates test measurement graphs 400 of another exemplary embodiment consistent with the present disclosure. In this graph, the strain measurement 402 is represented as a function of charge capacity 404 at three different age states of the battery 406, 408, 410, representing new, intermediate and aged states respectively. These age states may correspond, for example, to charge cycles from FIG. 3 selected from the left hand, middle and right hand portions of the strain measurement 306 respectively. As can be seen, when the battery is charged from a first charge capacity state Q1 to a second charge capacity state Q2, the strain changes. The rates of change, however, as well as the actual values, vary with battery age. Alternatively, the strain measurement can also be represented as a function of discharge capacity at three different age states of the battery to derive a similar trend for the rates of strain changes from Q1 capacity to Q2 capacity.

A new battery cell may therefore undergo an initial charge/discharge cycle, with strain measurements taken at any number of charge capacity intervals throughout the cycle (from Q1 to Q2), to profile or calibrate the battery at the beginning of battery life. This initial calibration curve, as represented for example in 406, may then be used as a basis for comparison with subsequent strain measurements taken at later stages in the life of the battery, for example 410. The difference in measured strain between the new battery and the aged battery, relative to the measured strain of the new battery, provides an indication of the degradation in charge capacity of the aged battery at a particular charge capacity point within the cycle range. An average of these degradation values taken at different charge capacity points within the cycle range may be used to estimate the SOH of the battery.

FIG. 5 illustrates a flowchart of operations 500 of one exemplary embodiment consistent with the present disclosure. At operation 510, a strain gauge is applied to the battery. At operation 520, a first strain measurement of the battery (S1) is performed, using the strain gauge, at a selected charge capacity of the battery and at an initial state of the battery. At operation 530, a second strain measurement of the battery (S2) is performed, using the strain gauge, at the selected charge capacity of the battery and at an aged state of the battery. At operation 540, the capacity degradation of the battery, from the initial state to the aged state, is estimated as equal to (S2−S1)/S1. The state of health of the battery may further be based on an average of estimated capacity degradations (as described herein), where each estimated capacity degradation is associated with a selected charge capacity of the battery through the range of the cycle (for example Q1 to Q2 from FIG. 4).

One preferred mathematical relationship is to now utilize a measured strain-sensor's signal for determining the SOC and SOH of the cell. The mathematical formulation preferably first separates the influence of the three major contributors to a change in strain measurement, namely, temperature, quantity of charge, and degradation at some selected level. The preferred formulation is not intended to differentiate among all possible mechanisms of degradation; rather, it is intended to capture the manifestation of these mechanisms on the voltage-strain relationships. The mathematical manipulation, then, decouples the temperature, eliminating its change. This is experimentally accomplished by controlling the cell temperature at all times. The math formulation representing the relationship between strain and SOC is then further simplified by assuming that, within a short period of time, the cell degradation is near zero, thus eliminating the SOH variation.

Given that the SOC-vs-strain is now known for a given instant in a cell's life, the expressions are extended for multiple stages of the cell's life. Furthermore, appropriate transformations are performed to ensure that the final formulation is based on measured parameters and calibration curves. The result is an expression that can triangulate the values of temperature, voltage, and strain to precisely establish the age of a cell. Furthermore, the expressions can be used to predict the features of the voltage-strain curves at a later stage of a cell's life and provide useful means for computing degradation margins from eminent failure.

Preferably, one now therefore relates the strain measurement(s) to the quantity of charge (SOC) inserted/extracted from the cell and the degradation (SOH) induced to the cell. As such, the change in strain is assumed to be primarily a function of temperature, SOC, and SOH in an additive manner as shown in Eq. 1.

$$d\varepsilon(T, SOC, SOH) = T \cdot \frac{\partial \varepsilon}{\partial T}\bigg|_T + SOC \cdot \frac{\partial \varepsilon}{\partial SOC}\bigg|_{SOC} + SOH \cdot \frac{\partial \varepsilon}{\partial SOH}\bigg|_{SOH} \quad (1)$$

At any given instant in time (or age of the cell), the SOH of the cell is nearly constant and the assumption is that $SOH_1$ is identical to $SOH_2$. This assumption allows us to derive Eqn. 2, which represents the change in the strain at an instant in the cell's life that is closely related in time. This in effect eliminates the third term of Eq. 1.

$$\Delta\varepsilon = \left[T_2 \cdot \frac{\partial \varepsilon}{\partial T}\bigg|_{T_2} - T_1 \cdot \frac{\partial \varepsilon}{\partial T}\bigg|_{T_1}\right] + \left[SOC_2 \cdot \frac{\partial \varepsilon}{\partial SOC}\bigg|_{SOC_2} - SOC_1 \cdot \frac{\partial \varepsilon}{\partial SOC}\bigg|_{SOC_1}\right] \quad (2)$$

Equation 2 indicates that the strain change is proportional partially due to the temperature and partially due to the crystallographic changes due to the quantity of charge in the active materials. Equation 2 can therefore be relatively complex to solve since the precise relationship between strain and temperature at each temperature and SOC is not known. A preferred technique herein to simplify this result is to decouple the temperature from the crystallographic changes by controlling the temperature of the cell to a near-constant value (e.g., +/−20° C. as in the range 20° C. to 40° C., or allowing electrochemical equilibrium to be reached before taking measurements. This reduces Eqn. 2 to $$\Delta\varepsilon = \left[SOC_2 \cdot \frac{\partial \varepsilon}{\partial SOC}\bigg|_{SOC_2} - SOC_1 \cdot \frac{\partial \varepsilon}{\partial SOC}\bigg|_{SOC_1}\right] \quad (3)$$

From Eq. 3, any detectable change in the strain measurement is due to the intercalation activity on the cell rather than temperature. This is generally valid for a cell at a given age. However, another preferred goal was to investigate the dependence of the strain on the age of the cell SOH. Since Eq. 3 applies only at a given age in time, an additional term is preferably included to represent the strain variation over the age as follows:

$$\Delta\varepsilon(SOC, SOH) = \Delta SOC \cdot \frac{\partial \varepsilon}{\partial SOC}\bigg|_{SOC,SOH} + \Delta SOH \cdot \frac{\partial \varepsilon}{\partial SOH}\bigg|_{SOC,SOH} \quad (4)$$

The measured strain ($\bar{\varepsilon}$) at any given time is the change in strain ($\Delta\bar{\varepsilon}$) relative to the strain value at the beginning of battery life, $\bar{\varepsilon}_o$, expressed as follows:

$$\bar{\varepsilon} = \bar{\varepsilon}_o + \Delta\bar{\lambda} \quad (5)$$

Substituting (5) into (4) and solving for SOH, an expression relating change in strain and SOC can be derived:

$$\Delta SOH = \left[\left(\Delta\bar{\varepsilon} - \Delta SOC \cdot \frac{\partial \varepsilon}{\partial SOC}\bigg|_{SOC,SOH}\right)\right] \cdot \frac{\partial SOH}{\partial \varepsilon}\bigg|_{SOC,SOH} \quad (6)$$

$$\Delta SOH = \left[\left((\varepsilon - \varepsilon_o) - \Delta SOC \cdot \frac{\partial \varepsilon}{\partial SOC}\bigg|_{SOC,SOH}\right)\right] \cdot \frac{\partial SOH}{\partial \varepsilon}\bigg|_{SOC,SOH} \quad (7)$$

$$\Delta SOH = \left[\left((\varepsilon - \varepsilon_o) - \Delta SOC \cdot \frac{\partial \varepsilon}{\partial SOC}\bigg|_{SOH}\right)\right] \cdot \frac{\partial SOH}{\partial \varepsilon}\bigg|_{SOC_{nom}} \quad (8)$$

In Eq. 8, the partial derivatives can also be transformed into other measurable quantities which are available during a charge/discharge event.

$$V_{cell}, \frac{\partial SOC}{\partial v_{OCV}}\bigg|_{SOH}, \frac{\partial \bar{\varepsilon}}{\partial v_{OCV}}\bigg|_{SOH} \Rightarrow \text{available}$$

By relating the change in charge to the cell voltage, Eq. 9, and substituting it into Eq. 8, a final relationship between SOH and measurable parameters such as strain and voltage is obtained:

$$\Delta SOC = \frac{\partial SOC}{\partial v_{OCV}}\bigg|_{SOH, SOC_{avg}} \cdot \Delta v_{ocv} \qquad (9)$$

$$\Delta SOH = \qquad (10)$$
$$\left[\left((\varepsilon - \varepsilon_o) - \left(\frac{\partial SOC}{\partial v_{OCV}}\bigg|_{SOH} \cdot \Delta v_{ocv}\right)\frac{\partial \varepsilon}{\partial SOC}\bigg|_{SOH}\right)\right] \cdot \frac{\partial SOH}{\partial \varepsilon}\bigg|_{SOH_{nom}}$$

$$\Delta SOH = \left[\left((\varepsilon - \varepsilon_o) - \left(\frac{\partial \varepsilon}{\partial v_{OCV}} \cdot \Delta v_{ocv}\right)\bigg|_{SOH}\right)\right] \cdot \frac{\partial SOH}{\partial \varepsilon}\bigg|_{SOC_{nom}} \qquad (11)$$

Figure 10:
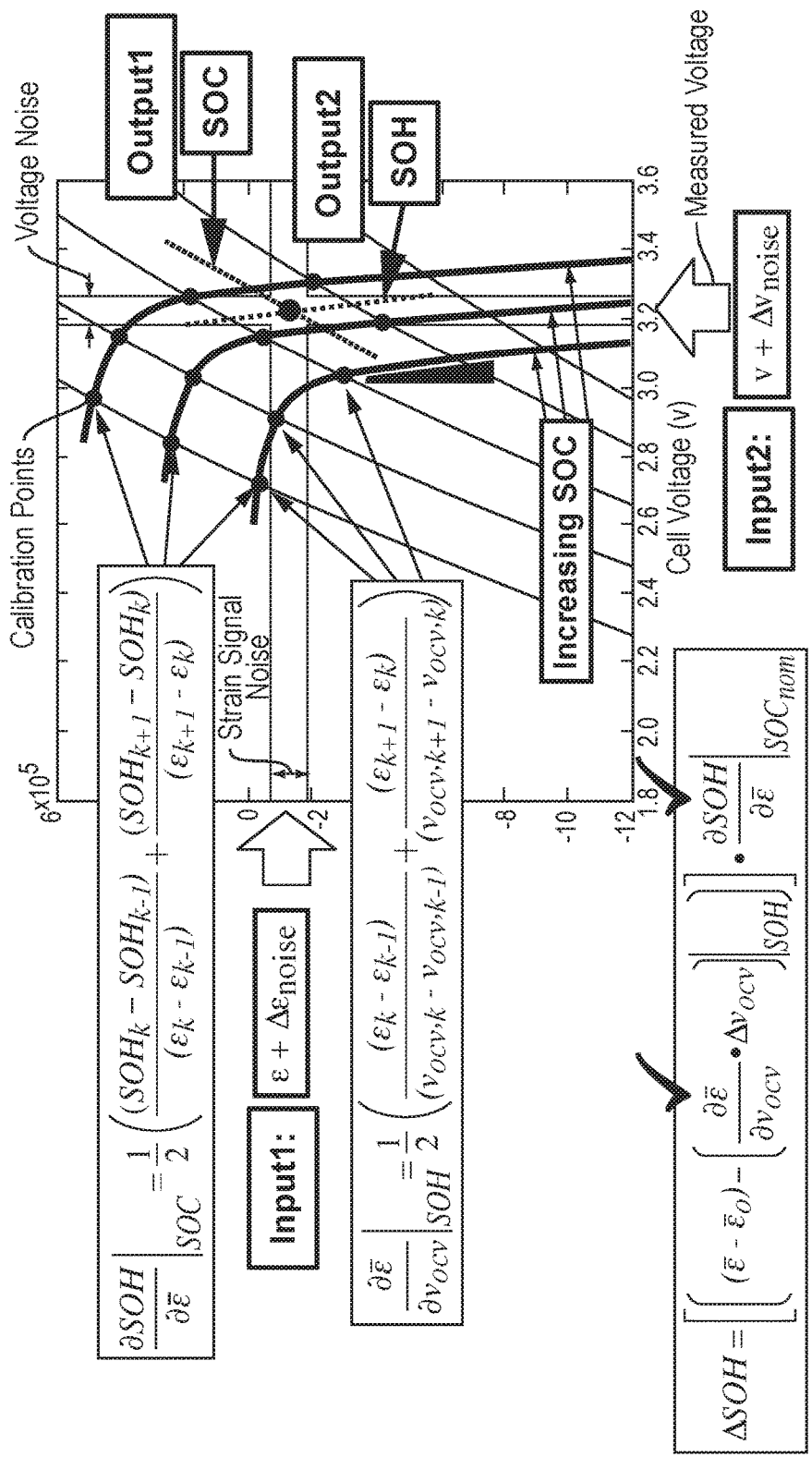
FIG. 10 illustrates a calibration curve of the cell.

Eq. 11 indicates that, at a nominal SOC, the change in SOH can be calculated if the change in strain is a function of voltage and the rate of change in SOH varies with respect to strain. These two terms can be obtained from a calibration curve of the cell, as shown in FIG. 10 and discussed more fully below. In the above and in FIG. 10, it should be noted that Vocv can be just Vload. OCV means open circuit voltage. In the description, Vocv can be replaced by Vload.

As presented in FIG. 10, on the x-axis, the measured voltage is identified by the indicated arrow. This voltage may have a certain degree of uncertainty or noise associated with it as identified. On the y axis, is the strain signal. It also may contain noise as identified. As can be seen for an increasing SOC there is a corresponding change in both the cell voltage and strain signal uniquely defined by the cell composition, cell chemistry, manufacturer, aged condition, and so on.

Input 1 refers to the strain measured by the sensor and corresponds to the mechanical manifestation of the quantity of intercalation/de-intercalation within the cell. Input 2 is the measured cell voltage but it could also be an electronic-unit processed voltage value representing the cell voltage. Furthermore, it could refer to the instantaneous cell voltage as well as the open-circuit voltage of the cell that is a function of SOC. The dots identified as calibration points define the relationship between strain and cell voltage at a particular age. The dot at the intersection of the dotted lines represents the present state of the cell (measured voltage and strain signals). The dotted lines indicate the interpolated curves (from the calibration data) in the neighborhood of the cell state. From this dot at the intersection, two outputs are generated. Output 1 refers to the cell SOC, while Output 2 refers to the cell's SOH. In FIG. 10, in the equations that indicate the partial derivative in the SOH with respect to strain, or the partial derivative in the strain with respect to $v_{ocv}$, k means the k step (or spot) of the partial derivative, k−1 is the step (or spot) before k, and k+1 is the step (or spot) after k.

Accordingly, it has now been recognized that as Li-ion batteries degrade during charge/discharge cycling, due to a number of different factors, the above referenced strain gauge measurement may be utilized to monitor the charge/discharge cycles, where it was recognized that the Li-ion battery cell did not return to its expected value of 100% SOC.

More specifically, Li-ion cells were tested with a LiFePO$_4$ cathode and graphite anode composition. The cell nominal capacity was 20 Ah in a prismatic format. What was then termed an "aggressive cycle" was applied to the cell, according to the following steps:

| Aggressive Cycle Testing Protocol | | | | |
|---|---|---|---|---|
| Step # | Test Item | Reference SOC | Approximate Charge/ Discharge Time (Hour) | Rest Time (Hour) |
| 1 | Set Oil Bath to Maintain at 30 Degree C | 0% | | 0 |
| 2 | Charge the cell using 3 C (20 × 3 = 60 A) and when the cell reaches 3.65 V, stop | 100% | 0.33 | 0 |
| 3 | Discharge the cell using 6 C (20 × 6 = 120 A) and when the cell reaches at 2.0 V, stop | 0% | 0.17 | 0 |
| 4 | Repeat Step 2 and 3 until cells have 200 accumulated cycles | | | |

In the above table, it is noted that the charge and discharge current of a battery cell is measured in C-rate. A discharge of 1 C draws a current equal to the rated capacity. For example, a battery cell rated at 20 Ah provides 20 A for one hour if discharged at 1 C rate. If one charges the cell using 3 C, that means the battery cell is charge in 60 A (20×3=60 A) and the battery cell will be fully charged in ~60/3=20 minutes, which is ~0.33 hour.

A thermocouple was located as follows for the purpose of monitoring the cell temperature profile:

Cell 1: Thermocouple was located on the surface of Cell 1's outer battery case enclosure, inside the oil bath.

Cell 2: Thermocouple was located on the surface of cell 2's outer battery case enclosure, inside the oil bath.

The applied temperature profile:
Step 1: Set oil bath temp at 30 degree C.
Step 2: Rest the cell at 30 degree for 2 hours
Step 3: Raise oil bath temp to 45 degree C.
Step 4: Hold 45 degree C. for 4 hours
Step 5: Drop the oil bath temp to 30 degree C.
Step 6: Rest the cell for overnight (>~10 hours)
Step 7: Stop As can be seen from the above, the revival cycle is generally thermal treatment, and preferably amounts to heating the battery to a temperature of less than or equal to 55° C.

Below is a summary of the cell degradation rate after similarly applied aggressive cycles of charging and discharging, defined above:

| Cell Degradation After Aggressive Cycles | | | |
|---|---|---|---|
| Test | Cell 1 | Cell 2 | Description |
| Test 1 | 3.30% | 3.95% | Aggressive Cycle |
| Test 2 | 2.46% | 2.86% | Aggressive Cycle |
| Test 3 | 3.05% | 3.31% | Aggressive Cycle |
| Revival Cycle (Test A) | | | Conditioning Test |
| Test 4 | 1.03% | 0.94% | Aggressive Cycle |
| Test 5[1] | 4.33% | 3.55% | Aggressive Cycle |
| Revival Cycle (Test B) | | | Conditioning Test |
| Test 6 | 1.48% | 0.89% | Aggressive Cycle |

[1]Note that Test 5 is after application of the aggressive charge/discharge cycling noted above (200 cycles of charging/discharging)

As can therefore now be seen from the above, Test 1 shows that Cell 1 and Cell 2 respectively indicated a cell degradation and loss in battery capacity of 3.30% and 3.95%, after aggressive cycling (200 cycles of charging/discharging), which means that Cell 1 would only hold 96.7% (=100%−3.30%) of its original capacity, and Cell 2 would only hold 96.05% (=100%−3.95%) of its original capacity.

Test 2 indicates that Cell 1 and Cell 2 respectively indicated a cell degradation and loss in battery capacity of 2.46% and 2.86%, respectively after aggressive cycling. This again means that Cell 1 would then only hold 94.24% (=100%−3.30% 2.46%) of its original capacity and Cell 2 would only hold 93.19% (=100%−3.95%−2.86%) of its original capacity.

Test 3 indicates that Cell 1 and Cell 2 respectively indicated a cell degradation and loss in battery capacity of 3.05% and 3.31%, respectively after aggressive cycling. This again means that Cell 1 would then only hold 91.19% (=100%−3.30%−2.46%−3.05%) of its original capacity and Cell 2 would only hold 89.88% (=100%−3.95%−2.86%−3.31%) of its original capacity.

Test 4 shows that after treatment with a revival cycle, as discussed above, the strain based testing herein confirms that the stressed state of the battery after aggressive cycling, which contributes to cell degradation, may now be relieved or reduced, as Cell 1's degradation and loss in battery capacity is reduced to only 1.03% and Cell 2's degradation and loss in battery capacity is reduced to 0.94% relative to their original capacities respectively. This now means that Cell 1 would hold 90.16% (=100%−3.30%−2.46%−3.05%−0.94%) of its original capacity and Cells 2 would hold 88.94% (=100%−3.95%−2.86%−3.31%−0.94%) of its original capacity. Then, Test 5 shows that after application of yet another round of aggressive cycling (200 cycles of charging/discharging), Cell 1's degradation and loss in battery capacity rises back up to 4.33% and Cell 2's degradation and loss in battery capacity rises back up to 3.55% relative to its original capacities respectively. This now means that Cell 1 would only hold 85.83% (=100%−3.30%−2.46%−3.05%−0.94%−4.33%) of its original capacity and Cell 2 would only hold 85.39% (=100%−3.95%−2.86%−3.31%−0.94%−3.55%) of its original capacity, as the battery is again in its pre-revival cycle treated degradation mode.

Test 6, after exposure to a another revival cycle, shows that Cell 1's degradation and loss in battery capacity is reduced to 1.48% and Cell 2's degradation and loss in battery capacity is reduced to 0.89% relative to their original capacities respectively. This now means that Cell 1 would hold 84.35% (=100%−3.30%−2.46% 3.05%−0.94%−4.33%−1.48%) of its original capacity and Cell 2 would hold 84.50% (=100%−3.95%−2.86%−3.31%−0.94%−3.55%−0.89%) of its original capacity.

As can therefore be seen from the above, the present invention allows for the monitoring and control of electrochemical cell degradation by use of strain-based battery testing. One may also implement a battery revival cycle to reduce the battery degradation rates, and readily confirm such reduction with the strain based testing disclosed herein.

In view of the foregoing, it may be appreciated that the present disclosure also relates to an article comprising a non-transitory storage medium having stored thereon instructions that when executed by a machine result in the performance of the steps of the methods as described in the examples herein such as, for example, in connection with the description associated with FIG. 5. In some embodiments, the method operations may be implemented in software and executed by a processor or may be implemented in hardware such as, for example, an application specific integrated circuit (ASIC) or field programmable gate array (FPGA).

Figure 11:
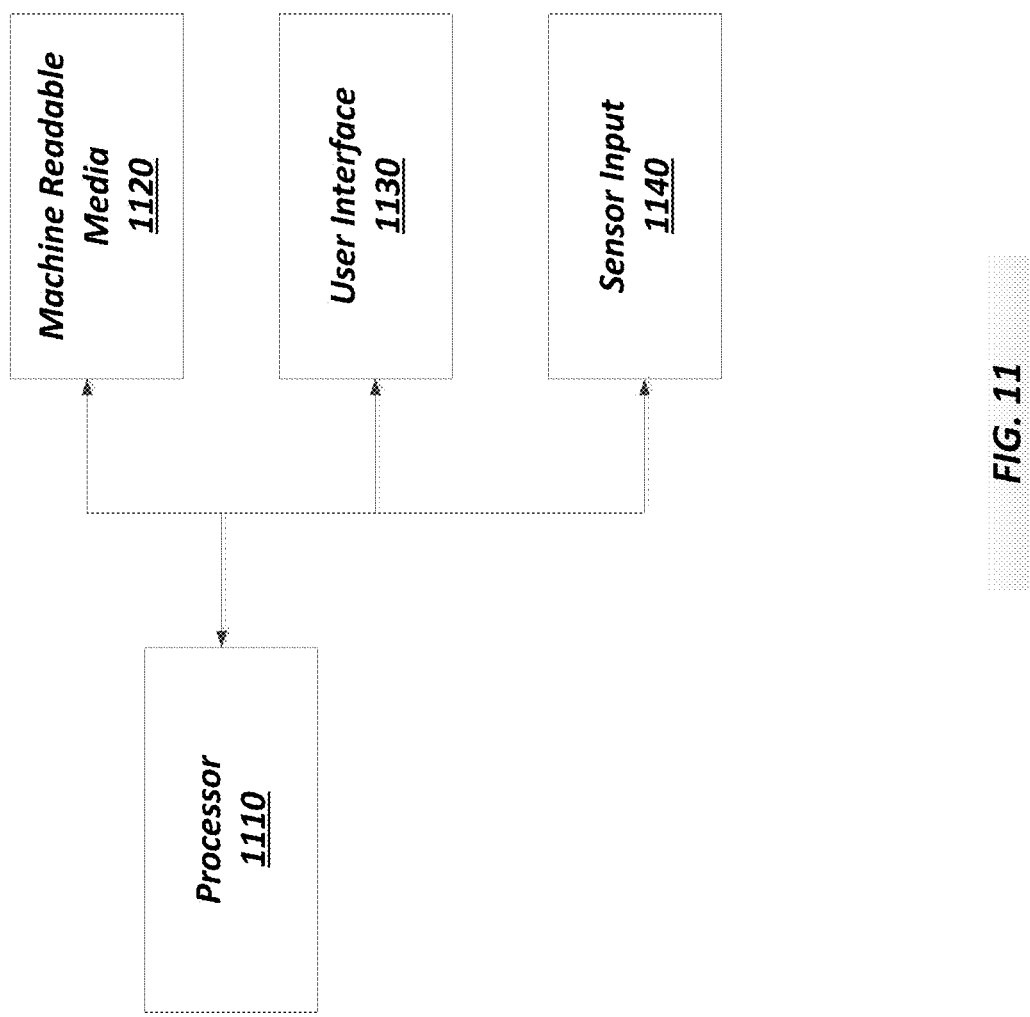
FIG. 11 illustrates a processor, machine readable media, user interface and sensor input that may be employed in an exemplary embodiment consistent with the present disclosure.

It should also be appreciated that the functionality described herein for the embodiments of the present invention may therefore be implemented by using hardware, software, or a combination of hardware and software, as desired. If implemented by software, a processor and a machine readable medium are required. The processor may be any type of processor capable of providing the speed and functionality required by the embodiments of the invention. Machine-readable memory includes any non-transitory media capable of storing instructions adapted to be executed by a processor. Non-transitory media include all computer-readable media with the exception of a transitory, propagating signal. Some examples of such memory include, but are not limited to, read-only memory (ROM), random-access memory (RAM), programmable ROM (PROM), erasable programmable ROM (EPROM), electronically erasable programmable ROM (EEPROM), dynamic RAM (DRAM), magnetic disk (e.g., floppy disk and hard drive), optical disk (e.g. CD-ROM), and any other device that can store digital information. The instructions may be stored on a medium in either a compressed and/or encrypted format. Accordingly, in the broad context of the present invention, and with attention to FIG. 11, the system and method for the herein disclosed strain measurement based battery testing may be accomplished with a processor (1110) and machine readable media (1120) and user interface (1130) plus sensor input (1140).

The foregoing description of several methods and embodiments has been presented for purposes of illustration. It is not intended to be exhaustive or to limit the claims to the precise steps and/or forms disclosed, and obviously many modifications and variations are possible in light of the teaching herein. It is intended that the scope of the invention be defined by the claims appended hereto.

What is claimed is:

1. A computer-implemented method for monitoring and control of electrochemical cell degradation and state of health (SOH) of a battery comprising:
    applying a strain gauge to said battery;
    measuring a first strain of said battery (S1) using said strain gauge at an initial state of said battery $\bar{\varepsilon}$;
    exposing said battery to charge/discharge cycling;
    measuring a second strain $\bar{\varepsilon}$ of said battery (S2) after charge/discharge cycling, using said strain gauge, wherein said second strain is equal to $\bar{\varepsilon}_o + \Delta\bar{\varepsilon}$, where $\Delta\bar{\varepsilon}$ is the measured change in strain;
    determining, by a controller, said measured change in strain $\Delta\bar{\varepsilon}$ based on said measured first (S1) strain and said measured second strain (S2) of said battery, wherein said measured change in strain $\Delta\bar{\varepsilon}$ is a function of battery voltage and the rate of change of said battery SOH varies with respect to strain;
    determining, by the controller, a change in the SOH of said battery after said charge/discharge cycling; and
    subsequent to determining the change in the SOH of said battery after said charge/discharge cycling, exposing said battery to a revival cycle comprising thermal treatment based on the SOH of said battery.

2. The method of claim 1, wherein said strain gauge is applied with direct physical contact to said battery.

3. The method of claim 1, wherein said strain gauge is applied to a strap, said strap configured to secure one or more battery cells of said battery.

4. The method of claim 1, wherein said strain gauge is applied to said battery along a selected dimension comprising at least one of a length, width or height of said battery, said selected dimension based on a response of said battery to a change from said initial state to said aged state.

5. The method of claim 1, wherein said strain gauge is applied to said battery along a selected dimension comprising any combination of length, width and height of said battery, said selected dimension based on a response of said battery to a change from said initial state to said aged state.

6. The method of claim 1, wherein said strain gauge is applied to said battery along a selected dimension to measure a change in volume of said battery.

7. The method of claim 1 wherein said thermal treatment comprises heating said battery at a temperature of less than or equal to 55° C.

8. A computer-implemented method for monitoring and control of electrochemical cell degradation and state of health (SOH) of a battery comprising:
   applying a strain gauge to said battery;
   measuring a first strain of said battery (S1) using said strain gauge at an initial state of said battery $\bar{\varepsilon}_o$;
   exposing said battery to charge/discharge cycling;
   measuring a second strain $\bar{\varepsilon}$ of said battery (S2) after said charge/discharge cycling, using said strain gauge, wherein said second strain is equal to $\bar{\varepsilon}_o + \Delta\bar{\varepsilon}$, where $\Delta\bar{\varepsilon}$ is the measured change in strain;
   determining, by a controller, said measured change in strain based on said measured first (S1) strain and said measured second strain (S2) of said battery, wherein said measured change in strain $\Delta\bar{\varepsilon}$ is a function of battery voltage and the rate of change of said battery SOH varies with respect to strain;
   determining, by the controller, a change in the SOH of said battery after said charge/discharge cycling; and
   exposing said battery to a revival cycle comprising thermal treatment wherein said battery SOH is determined to be less than or equal to 2.0%.

9. The method of claim 8 wherein said charge/discharge cycling comprising a plurality of cycles.

10. The method of claim 9, wherein said plurality of charge/discharge cycles comprises up to 200 cycles.

11. The method of claim 8 wherein subsequent to said battery revival cycle said battery SOH is determined to be less than or equal to 1.0%.

12. A computer-readable medium having stored thereon a plurality of non-transitory instructions that when executed by a controller result in the following operations for monitoring and control of electrochemical cell degradation and state of health (SOH) of a battery, wherein said battery includes a strain gauge:
   causing to be measured a first strain of said battery (S1) using said strain gauge at an initial state of said battery $\bar{\varepsilon}_o$;
   causing to be exposed said battery to charge/discharge cycling;
   causing to be measured a second strain $\bar{\varepsilon}$ of said battery (S2) after said charge/discharge cycling, using said strain gauge, wherein said second strain is equal to $\bar{\varepsilon}_o + \Delta\bar{\varepsilon}$, where $\Delta\bar{\varepsilon}$ is the measured change in strain;
   determining, by a controller, said measured change in strain $\Delta\bar{\varepsilon}$ based on said measured first (S1) strain and said measured second strain (S2) of said battery, wherein said measured change in strain $\Delta\bar{\varepsilon}$ is a function of battery voltage and the rate of change of said battery SOH varies with respect to strain;
   determining a change in the SOH of said battery after said charge/discharge cycling; and
   exposing said battery to a revival cycle comprising thermal treatment wherein said battery SOH is determined to be less than or equal to a predetermined value.

13. The computer-readable medium of claim 12, wherein said predetermined value is 2.0%.

* * * * *